(12) United States Patent
Tzeng et al.

(10) Patent No.: US 6,396,767 B1
(45) Date of Patent: May 28, 2002

(54) DEVICE FOR ACCESSING A ROM UNIT WITH GROUPS OF MEMORY MODULE INFORMATION SAVED THEREIN

(75) Inventors: Denny Tzeng; Lan Chih-Hung; Lee Ching-Kuo, all of Taipei (TW)

(73) Assignee: TwinMOS Technologies, Inc. (TW)

( * ) Notice: Subject to any disclaimer, the term of this patent is extended or adjusted under 35 U.S.C. 154(b) by 0 days.

(21) Appl. No.: 09/725,190

(22) Filed: Nov. 29, 2000

(51) Int. Cl.[7] .................................................. G11C 8/00
(52) U.S. Cl. .............................. 365/230.06; 365/230.02
(58) Field of Search ......................... 365/230.06, 230.02

(56) References Cited

U.S. PATENT DOCUMENTS 5,303,192 A * 4/1994 Baba ........................... 365/200

* cited by examiner

*Primary Examiner*—M. Tran
(74) *Attorney, Agent, or Firm*—Troxell Law Office PLLC

(57) ABSTRACT

A device for accessing a ROM unit with groups of module information of memory modules saved therein. This invention saves plural groups of memory module information in a ROM unit, and applies a selecting circuit to indicate a memory module information to be loaded out. In an embodiment, the selecting circuit has a voltage divider circuit driven by the WP Pin of an IC, and a comparer or a converter to connect with the voltage divider circuit so as to produce a selecting signal, and then uses a decoder to transfer the selecting signal into a address number which will be used to read the selected memory module information from the ROM unit. In another embodiment, the selecting circuit has a plurality of fuses which are connected with plural output-pins of an IC, and multiplexers to optionally disconnect some fuses of the fuse circuit so as to generate kinds of different selecting signals. The selecting signals will then be decoded to locate the required memory module information from the ROM unit.

9 Claims, 5 Drawing Sheets

DEVICE FOR ACCESSING A ROM UNIT WITH GROUPS OF MEMORY MODULE INFORMATION SAVED THEREIN

FIELD OF THE INVENTION

This invention is a device for accessing a ROM unit with groups of memory module information of memory modules saved therein, and more particularly having a Mask ROM unit to replace an EEPROM unit in prior art.

BACKGROUND OF THE INVENTION

Please refer to FIG. 1. A DRAM module is basically constructed by a combination of a Memory Module IC 1 and a DRAM unit 2. The DRAM unit 2 is used to save data, as we have well known. And the Memory Module IC 1 is used to store the information like cell-speed, cell-type, number and size of cells, and other module information of the DRAM unit 2 so as to offer status data of the DRAM unit 2 for a computer system. And, of course, different DRAM modules need to save different information into the Memory Module IC 1. In prior art, an EEPROM is mostly served as this Memory Module IC 1 and, according to the DRAM unit it adapted to, specialized memory module information is imported by DRAM Modules producers.

Please refer to FIG. 2. An EEPROM 12 is arranged. A WP Pin (Write Protect Pin) of the EEPROM 12 connects with a resister 11 and electrically to the GND. This circuit is therefore designed to control the read/write actions of the EEPROM 12.

However, several disadvantages are caused by using an EEPROM as the Memory Module IC, which are:
1, EEPROM is expensive.
2, To Input the Memory Module Information are time cost.
3, The data inputting process may have errors.
4, EEPROM may lose data by effects of surrounding or miss operations of users.

SUMMARY OF THE INVENTION

The object of this invention is to resolve said disadvantages. The invention replaces the EEPROM in prior art by a ROM unit (such as a Mask ROM). Groups of memory module information are pre-formed in the Mask ROM and been selectable for different DRAM memory modules. By having a Mask ROM as the memory module IC, the cost will be reduced because Mask ROM is generally cheaper than EEPROM. The data inputting process can also be omitted and therefore avoid any errors caused during it. And at last, data saved in a Mask ROM will not easily lose by surrounding effects and is unable to change by any users. So, this replacement will overcome said disadvantages of the prior art.

So, this invention is a device for accessing a ROM unit with groups of module information of different memory modules saved therein. The device comprises a selecting circuit which, according to an outer signal, generates a selecting signal, and a decoding circuit which decodes the selecting signal, and a ROM array which saves plural groups of memory module information, and finally a control circuit which operates reading procedure of said memory module information from ROM unit.

In an embodiment, a divider circuit is designed in said selecting circuit. By changing resisters of said divider circuit, corresponded voltages will be read by a comparer, which includes several OP amplifiers, to generate the selecting signal. The selecting signal will thereafter be transferred to the decoding circuit.

In another embodiment, an A/D Converter is applied to replace the comparer. The value of the corresponded voltage will be transformed into a digital signal, which serves as the selecting signal, and then to the decoder circuit.

In another embodiment, multiplexers and fuse disconnecting technique is applied to select the memory module information without changing IC Pin Design. The multiplexers lead signals from the IC pins to two channels: the first output terminals and the second output terminals. Each of the first terminals connects to a fuse and to the decoder circuit. The second terminal connects to the control circuit in the other hand. To disconnect a fuse, a disconnection high voltage (compared to normal voltage) is supplied from the pin(s) of the IC. And another high voltage is applied to a control pin and to a voltage decline circuit inside the IC. The voltage decline circuit operates the multiplexers' control terminals to have the multiplexers switched their output tunnels from the second output terminals to the first output terminals. At this moment, the disconnection high voltage from the pin(s) is applied to the fuse(s), which is connected with the first output terminals and planed to be disconnected. After said motion, the status of these fuses will be explained by the decoder circuit as an address signal for the ROM unit.

After disconnection, the multiplexers turn their output back to the second terminal which become normal control lines for the control circuit.

However, a switch system is set between the voltage decline circuit and the control circuit which will turn off, when the voltage from the voltage decline circuit is too high to damage the control circuit.

BRIEF DESCRIPTION OF THE DRAWINGS

These and other features and advantages of the present invention will become more apparent from the following detailed description of an exemplary embodiment thereof as illustrated in the accompanying drawings, in which.

DETAILED DESCRIPTION OF THE INVENTION

Figure 1:
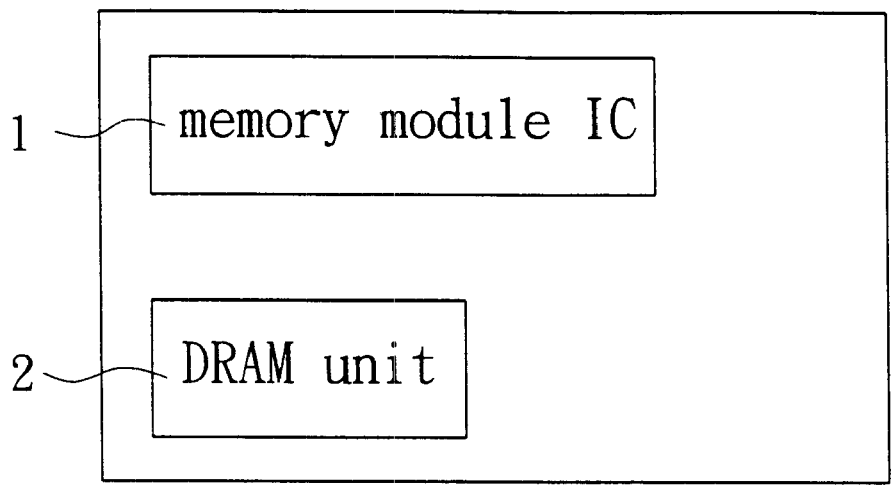
FIG. 1 is a perspective view of the prior DRAM module.
Figure 2:
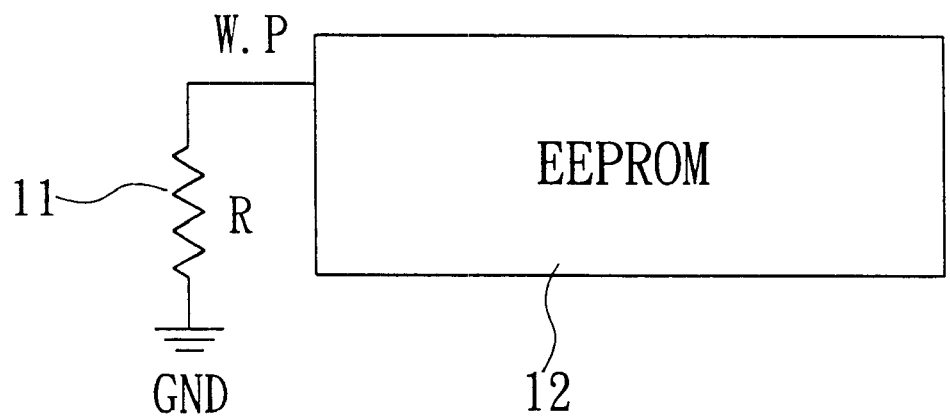
FIG. 2 is a constructed view of EEPROM in prior art.
Figure 3:
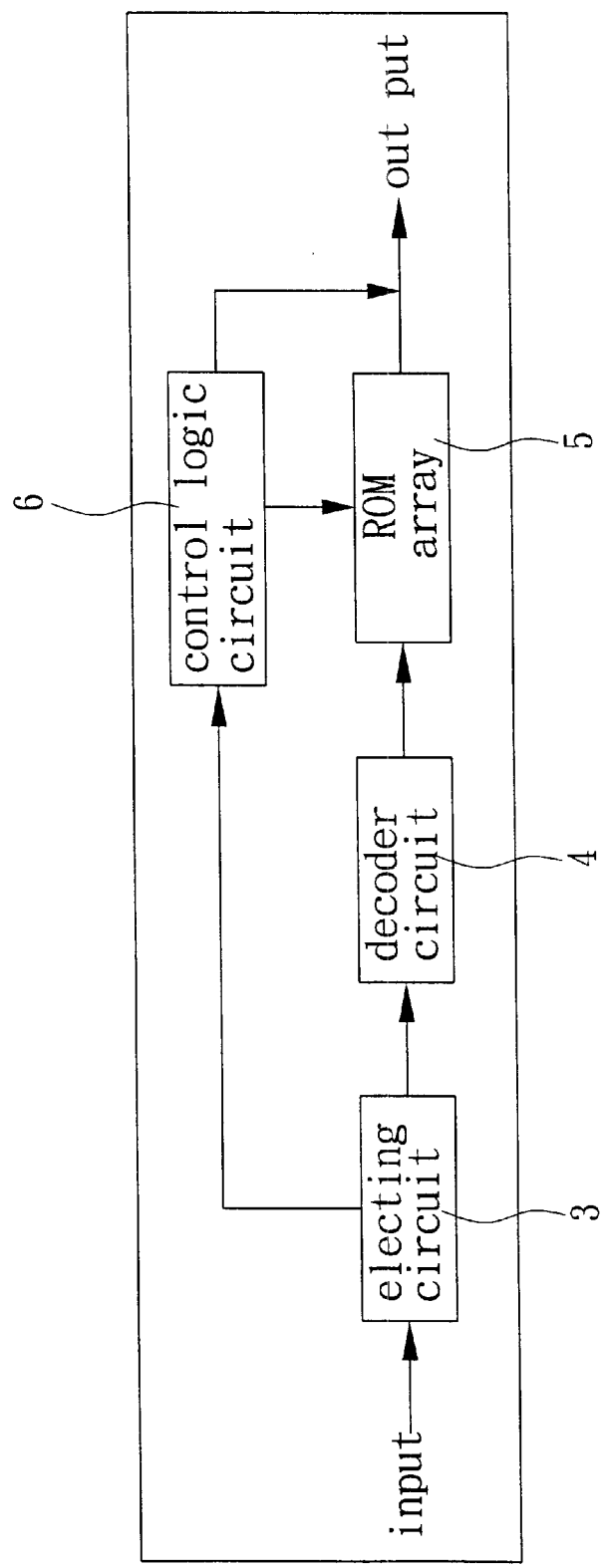
FIG. 3 is a constructed view of Mask ROM in this invention.

Please refer to FIG. 3, a device to access the memory module information saved in a ROM unit. The ROM unit is preferred as a Mask ROM. However, all kinds of Read-Only-Memory are adaptable. The device comprises a selecting circuit 3, a decoder circuit 4, a ROM array 5 and a control circuit 6. According to an outer command, the selecting circuit 3 may generate a corresponded selecting signal and transfer this selecting signal to said decoder circuit 4. The input terminal of the decoder circuit 4 is connected to the output terminal of the selecting circuit 3. And the output terminal of the decoder circuit 4 is connected to the input terminal of the ROM array 5. By said connection, the decoder circuit 4 decodes the selecting signal and sends the results to the ROM array 5. The ROM array 5 has some groups of pre-saved memory module information which are adapted to different kinds of memory modules. However, one set of the memory module information of the groups will be indicated to express the status of the RAM module it jointed. The control circuit 6 commands accessing processes of the ROM array 5.

Figure 4:
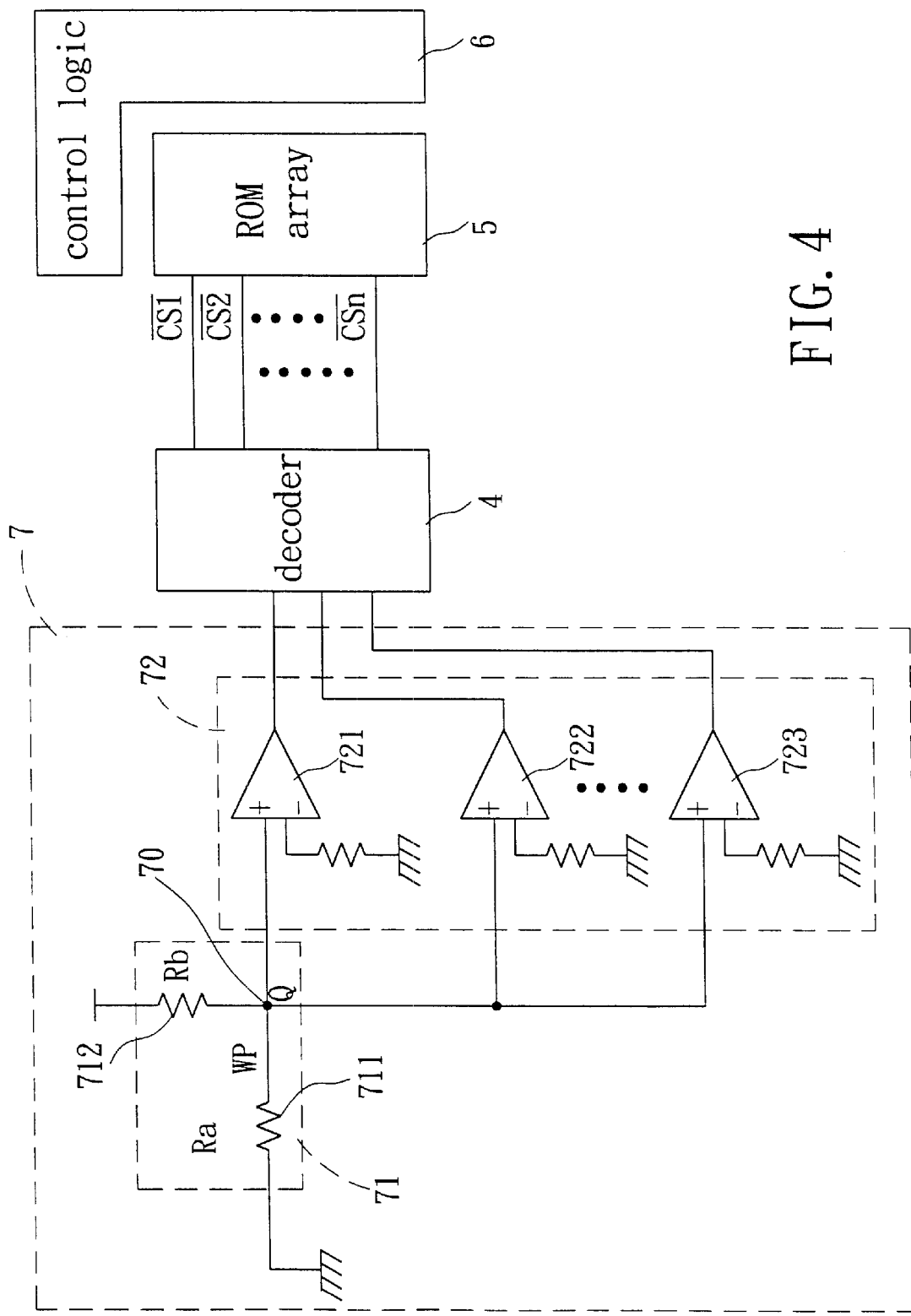
FIG. 4 is a selecting circuit with a divider circuit and comparer which is made up by several OP amplifiers.

Please refer to FIG. 4, the first embodiment of the invention. The selecting circuit 7 includes a divider circuit 71 and a comparer 72 which is made up by several OP amplifiers 721, 722, 723. The divider circuit 71 has an outer resister 711 and an inner resister 712. During operation, an outer signal effects resister value of the outer resister 711, so that a corresponded voltage is generated at a detecting point Q 70. By these phenomena, a comparer 72 with three OP amplifiers 721, 722, 723 identifies the Q voltage. The three OP amplifiers 721, 722, 723 reflect to different voltage and generate corresponded signals. The corresponded signals (selecting signal ) are decoded by the decoder circuit 4 and the result will be defined to locate one set of memory module information saves in the ROM array 5. So, in this embodiment, adjusting the outer resister 711 can choose groups of memory module information.

In this embodiment, GND ,the outer resister 711 of the divider circuit 71 connected with, is the WP Pin of EEPROM. This means that in this embodiment, a mask ROM can directly replace prior EEPROM without changing any pin design. And of course, it's also possible to use other pins for the outer resister 711.

Figure 5:
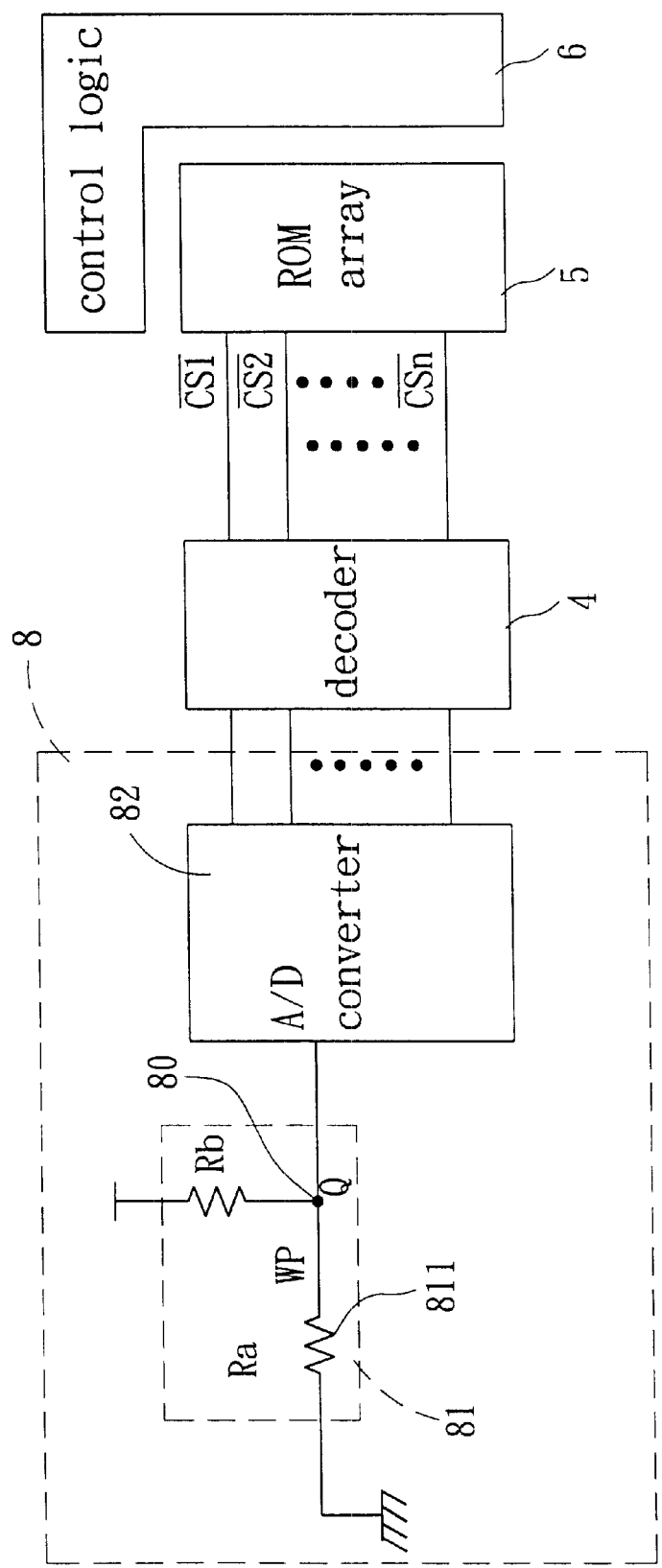
FIG. 5 is a selecting circuit with divider circuit and A/D converter.

Please refer to FIG. 5, the second embodiment of the invention. An A/D converter 82 replaces the comparer 72 in FIG. 4 to form another selecting circuit 8. The divider circuit 81 has the same function as the one in the first embodiment. The A/D converter 82 transforms the voltage at detecting point Q 80 into a digital signal (the selecting signal). The digital signal is decoded by the decoder circuit 4 into corresponded signal (the address signal). This corresponded signal will therefore serve to locate the required memory module information saved in the ROM array 5.

Figure 6:
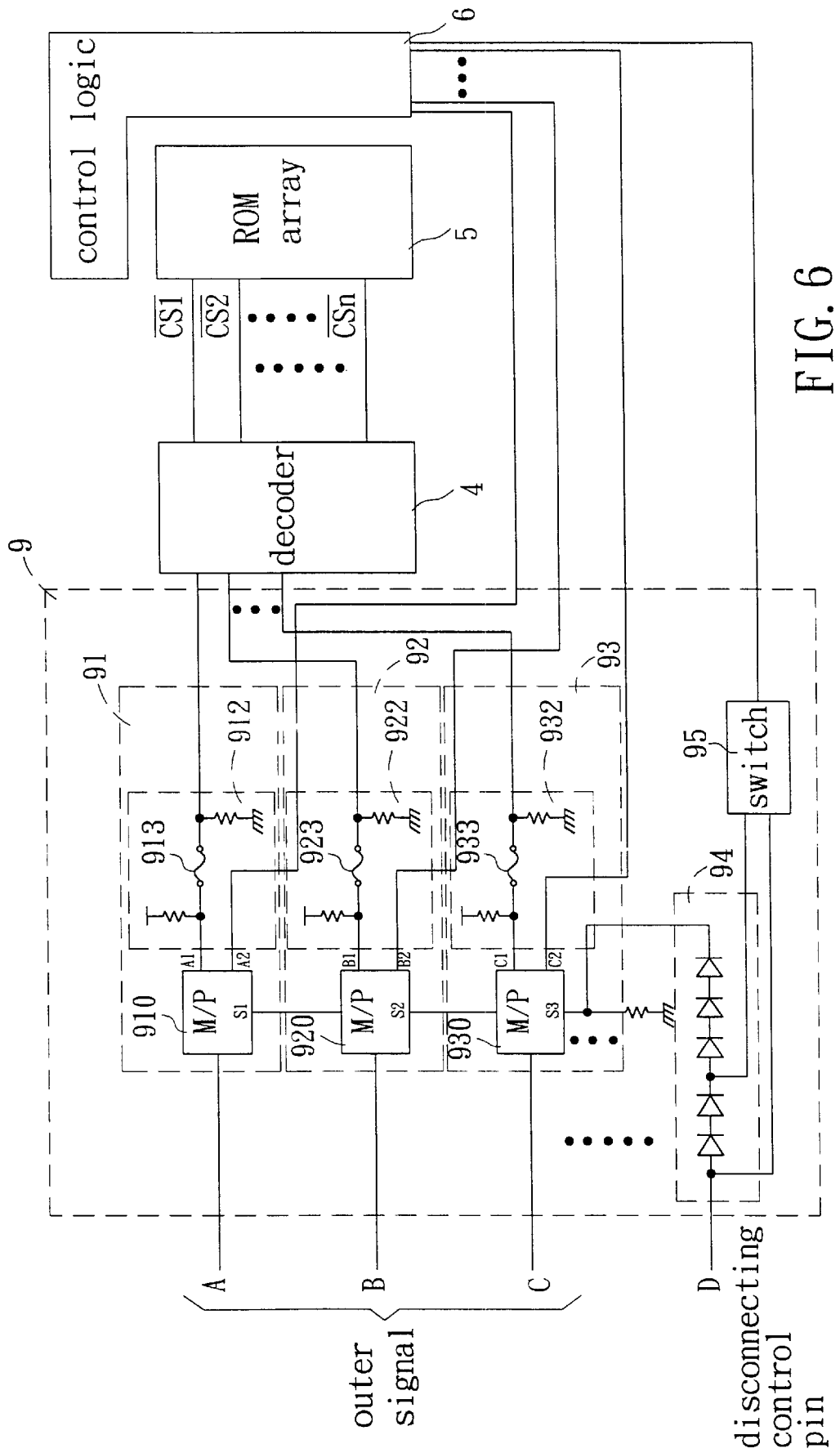
FIG. 6 is a selecting circuit with multiplexers, a voltage decline circuit and a switch system.

Please refer to FIG. 6, the third embodiment whose selecting circuit is made up by several multiplexers and also could be set in without changing any pin designs. The selecting circuit 9 of this embodiment comprises three multiplexer-fuse units 91, 92, 93, and a voltage decline circuit 94 and a switch system 95. Every multiplexer-fuse unit 91,92,93 has a multiplexer (910,920,930) and a fuse circuit(912,922,932). The outer signal for selecting 70 a memory module information is sent from IC pins A, B,C. Each IC pins A,B,C connects to input terminals of the multiplexers 910,920,930. Each multiplexer 910, 920, 930 has two output terminals call first output terminals (A1,B1, C1) and second output terminals (A2,B2,C2). The three first output terminals (A1,B1,C1) connect to the three fuses 913,923,933 and the three second output terminals (A2,B2, C2) connect to the control circuit 6. The three fuses 913, 923,933 also connect to the decoder circuit 4.

In this embodiment, the decoder circuit 4 will generate different signals according to status of the fuses 913,923, 933. To change the status of the fuses 913,923,933, mostly by disconnecting these fuses, a disconnection high voltage from IC is first supplied to the pin(s) whose corresponded fuse(s) is chosen to disconnect. By the way, a control high voltage from Pin D is applied to the voltage decline circuit 94. The voltage decline circuit 94 has some diodes (five in this embodiment) and connects to control terminals (S1,S2, S3) of the multiplexers (910,920,930). The output voltage of the voltage decline circuit 94 is controlled by reduced by threshold voltages of diodes, so as to fit the required voltage of the control terminals (S1,S2,S3).

After receiving a control voltage from the voltage decline circuit 94, the multiplexers (910,920,930) switch their output tunnels from the second output terminals (A2,B2,C2) to the first output terminals (A1,B1,C1). At this moment, the disconnection high voltage from the pin(s) (A,B,C) is applied to the fuse(s) 913,923,933 which is planed to disconnect. After said motion, the status of these fuses 913,923,933 is explained by the decoder circuit 4 into address signals.

After disconnection, the multiplexers 910,920,930 lead the signals of the pins A,B,C out from the first output terminals (A1,B1,C1) back to the second terminals (A2,B2, C2). Therefore the second terminals (A2,B2,C2) become to serve as control lines for the control circuit 6. The pins A,B,C also turn back to normal using. There is also a switch system 95 set between the voltage decline circuit 94 and the control circuit 6. The switch system 95 can turn off, when the voltage from the voltage decline circuit 94 is too high to damage the control circuit 6.

If there were eight OP amplifiers or three multiplexers applied in present invention, eight selecting signals can be generated by the decoder circuit 4 which means that eight groups of memory module information can be accessed in the ROM unit. So, if there were sixteen OP amplifiers or four mulitiplexers applied in the invention, it can locate sixteen groups of memory module information saved in the ROM unit.

Form the above, the invention is defined as a device which access groups of memory module information through a combination of a selecting circuit, a decoder circuit and a ROM unit. In this invention, a mask ROM replaces the EEPROM unit without changing any pin designs of prior art.

And by-this replacement, cost is reduced, errors is avoided. And more, the surrounding effects will also be limited. These advantages had effectively covered the weaknesses of prior art . It's understood that the above-described embodiment is merely illustrative of the possible specific embodiment which may present main principles of the invention. Other arrangements may readily by devised in accordance with these principles by those skilled in art without departing from the scope and spirit of the invention.

What is claimed is:

1. A device for accessing a ROM unit with groups of module information of memory modules saved therein, comprising:

a ROM array, stores groups of memory module information, wherein the groups of memory module information adapt to kinds of different memory modules:

a selecting circuit which generates selecting signals;

a decoder circuit, which, according to the selecting signal, generates a corresponded signal, wherein the corresponded signal indicates a corresponded memory module information from the ROM array, wherein the selecting circuit further comprises: plural multiplexer-fuse units, each of which includes a multiplexer and a fuse, wherein said multiplexer-fuse unit, according to an outer command, controllably disconnects at least one of said fuses to form kinds of fuse-status which are relied on by the decoder circuit to generate address signals.

2. The device according to claim 1, further comprising:
a control circuit to control the reading process of the ROM array.

3. The device according to claim 1, wherein the selecting circuit further comprises:
a voltage decline circuit, which has one input terminal, connected to an IC pin and one output terminal connected to control terminals of the multiplexers, to generate a control voltage to control the multiplexer in outputting.

4. The device according to claim 3, wherein the selecting circuit further comprises:
a switch system which manages the electrical connection between the voltage decline circuit and the control circuit, so as to protect the control circuit from high voltage damage.

5. The device according to claim 1, wherein the fuse is connected between the multiplexer and an input terminal of the decoder circuit.

6. The device according to claim 5, further comprising:
a control circuit to control the reading process of the ROM array.

7. The device according to claim 1, further comprising:
a control circuit to control the reading process of the ROM array.

8. A device for accessing a ROM unit with groups of module information of memory modules saved therein, comprising:
a ROM array, stores groups of memory module information, wherein the groups of memory module information adapt to kinds of different memory modules:
a selecting circuit which generates selecting signals;
a decoder circuit, which, according to the selecting signal, generates a corresponded signal, wherein the corresponded signal indicates a corresponded memory module information from the ROM array, wherein the selecting circuit further comprises: a divider circuit which includes an outer resister and an inner resister by which to generate a controllable divided voltage; and a comparer, including several OP amplifiers, which processes the divided voltage and output signals to the decoder circuit.

9. A device for accessing a ROM unit with groups of module information of memory modules saved therein comprising:
a ROM array, stores groups of memory module information, wherein the groups of memory module information adapt to kinds of different memory modules:
a selecting circuit which generates selecting signals;
a decoder circuit, which, according to the selecting signal, generates a corresponded signal, wherein the corresponded signal indicates a corresponded memory module information from the ROM array, wherein the selecting circuit further comprises: a divider circuit which includes an outer resister and an inner resister by which to generate a controllable divided voltage; and a converter which processes the divided voltage and output signals to the decoder circuit.

* * * * *